(12) United States Patent
McClellan

(10) Patent No.: US 6,545,347 B2
(45) Date of Patent: Apr. 8, 2003

(54) ENHANCED LEADLESS CHIP CARRIER

(75) Inventor: Neil McClellan, Hong Kong (HK)

(73) Assignee: ASAT, Limited, Tsuen Wan (HK)

( * ) Notice: Subject to any disclaimer, the term of this patent is extended or adjusted under 35 U.S.C. 154(b) by 0 days.

(21) Appl. No.: 09/799,968

(22) Filed: Mar. 6, 2001

(65) Prior Publication Data

US 2002/0125559 A1 Sep. 12, 2002

(51) Int. Cl.[7] .................................................. H01L 23/48
(52) U.S. Cl. ...................... 257/690; 257/666; 257/670; 257/676; 257/678; 257/684; 257/686
(58) Field of Search ............................... 257/666, 670, 257/676, 684, 691, 678, 686, 698, 712, 719, 730; 438/106, 107, 108; 361/704, 709

(56) References Cited

U.S. PATENT DOCUMENTS 5,386,141 A * 1/1995 Liang et al. ................. 257/676
5,438,478 A * 8/1995 Kondo et al. ................ 174/260
6,229,200 B1 * 5/2001 Mclellan et al. ............. 257/666

* cited by examiner

Primary Examiner—David Nelms
Assistant Examiner—Mai-Huong Tran
(74) Attorney, Agent, or Firm—Gallagher & Lathrop; Thomas A. Gallagher

(57) ABSTRACT

A plastic integrated circuit package includes a lead frame having numerous leads, a die attach pad and a ground ring. In one embodiment, the plastic integrated circuit package is provided as a plastic leadless chip carrier. Slots provided between the die attach pad and the ground ring provides support and prevent delamination from the plastic molding compound and enhanced moisture-resistance, thus resulting in a highly reliable integrated circuit package, even in the face of high temperature cycles, such as solder reflows.

5 Claims, 2 Drawing Sheets

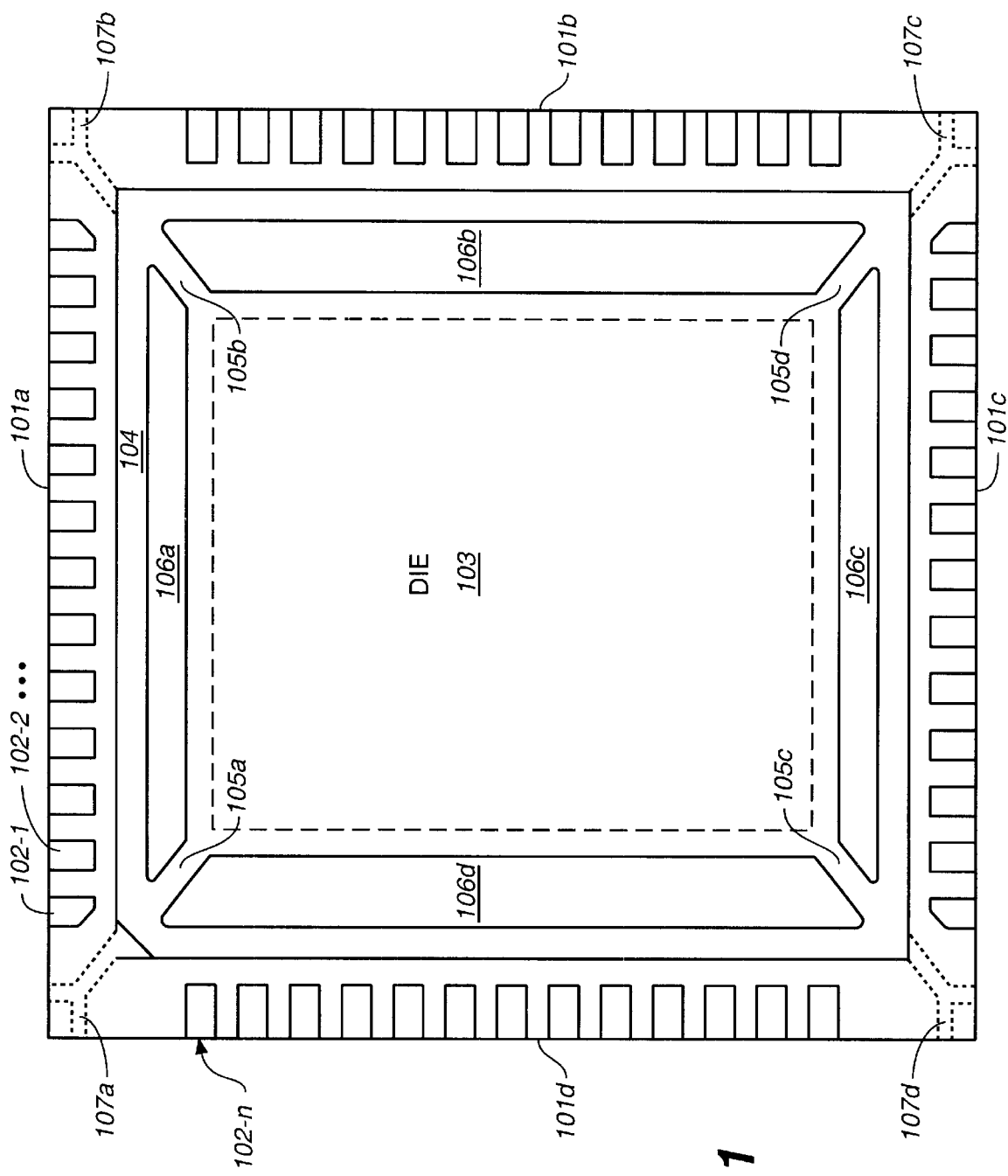
FIG._1

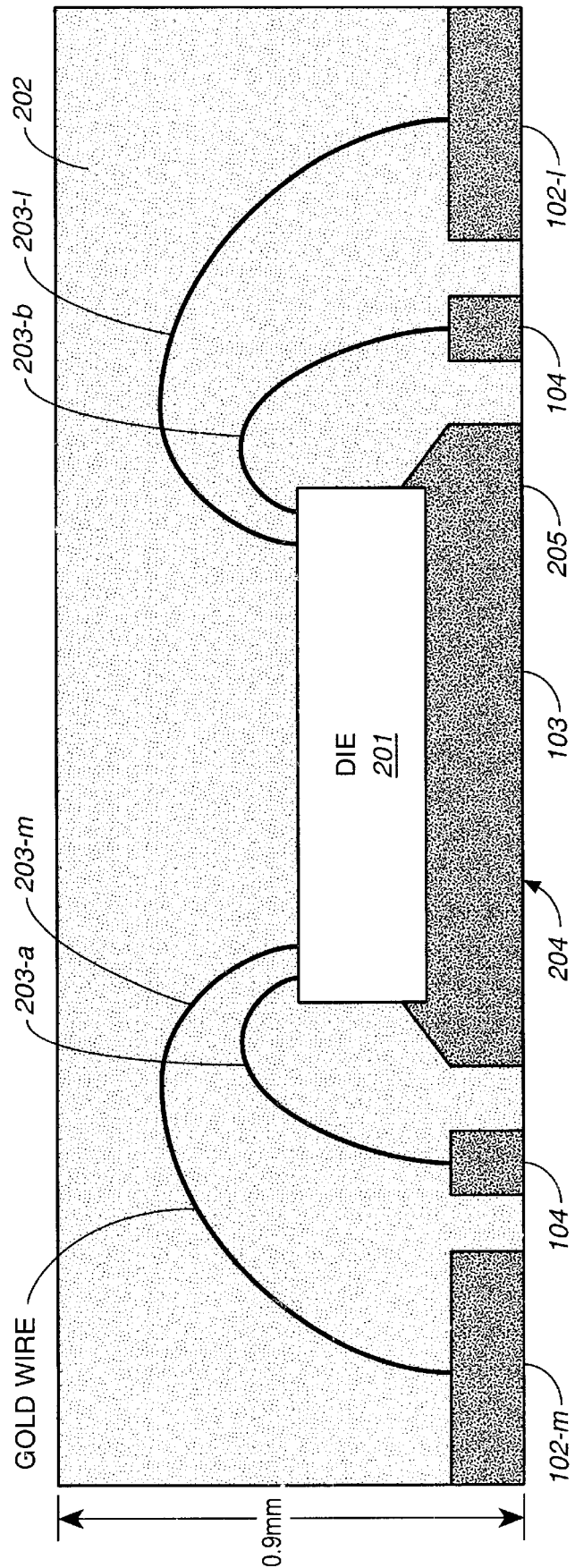
FIG._2

ENHANCED LEADLESS CHIP CARRIER

BACKGROUND OF THE INVENTION

1. Field of the Invention

The present invention relates to integrated circuit packaging. In particular, the present invention relates to a leadless plastic chip carrier with enhanced moisture-resistance.

2. Discussion of the Related Art

Plastic packages with a die attach pad optimized for increased thermal and electrical performances are described, for example, in co-pending patent application ("First Copending Application"), entitled "Optimized Pad Lead Frame Design" by N. McClellan et al., Ser. No. 09/222,579, filed on Dec. 28, 1998. To provide additional background information, the disclosure of the First Copending Application is hereby incorporated by reference in its entirety. Such plastic packages, among numerous other advantages, minimize exposure of the die attach pad to the molding compound, provide better placement of the semiconductor die, and allow the same lead frame to be used with semiconductor dies of varying sizes.

The present invention provides additional advantages in addition to those provided by conventional plastic packages with optimized die attach pads.

SUMMARY OF THE INVENTION

According to the present invention, an integrated circuit package for accommodating a semiconductor die is provided including: (1) a conductive lead frame, (2) wire-bonds coupling the semiconductor die to various elements of the lead frame, and (3) a plastic or resin encapsulation for enclosing the bond wires and the semiconductor die. The lead frame includes: (a) a die attach pad for accommodating the semiconductor die, (b) a ring provided adjacent to the die attach pad to provide a ground plane, and (c) leads for external connections.

In one embodiment, the attach pad and the ring are spaced from each other by slots filled by the insulative encapsulation, except at one or more designated metal connection points, where they are connected by tie bars. The ring and the die attach pad lock the molding compound at the slots, so as to prevent delamination from the molding compound that may allow moisture to enter the package. In one embodiment, a solder plating is provided on the exposed surface of the lead frame, so as to allow enhanced external electrical contact (e.g., to a printed circuit board).

In one embodiment, the lead frame includes half-etched tie-bars for suspending the ring. The half-etched tie-bars, which are substantially completely enclosed by the molding compound, provide mechanical support for the die attach pad and the ring.

The present invention is better understood upon consideration of the detailed description below and the accompanying drawings.

BRIEF DESCRIPTION OF THE DRAWINGS

FIG. 1 shows lead frame 100 in one embodiment of the present invention.

FIG. 2 shows packaged integrated circuit 200 including lead frame 100 in accordance with the present invention.

DETAILED DESCRIPTION OF THE PREFERRED EMBODIMENTS

An integrated circuit package in accordance with the present invention can be manufactured under a conventional process for manufacturing plastic package integrated circuits. One example of such a manufacturing process is disclosed in co-pending patent application ("Second Copending Application"), Ser. No. 09/095,803, entitled "Saw-singulated Leadless Plastic Chip Carrier," by N. McClellan et al., filed on Jun. 10, 1998. To provide a detailed description of such a manufacturing process, the disclosure of the Second Copending Application is hereby incorporated by reference in its entirety.

FIG. 1 shows a portion of lead frame 100 in one embodiment of the present invention. Lead frame 100 is suitable for use in a leadless surface mount package, also known as a "leadless plastic chip carrier." In FIG. 1, the portion of lead frame 100 inside lines 101a, 101b, 101c and 101d is shown. During singulation, the packaged integrated circuit is singulated from a support structure integrally formed with the lead frame by cutting along lines 101a, 101b, 101c and 101d, as is known in the art. Lead frame 100 can be provided, for example, in a metal panel (e.g., copper). As shown in FIG. 1, lead frame 100 includes (a) leads 102-1, 102-2, ..., 102-n provided at the periphery of the package, (b) die attach pad 103 provided at the center, and (c) ring 104 positioned between die attach pad 103 and leads 102-1, 102-2, ... and 102-n. Die attach pad 103 accommodates a semiconductor die, which is attached, for example, by an epoxy adhesive. Wire bonds (not shown) are provided to connect bonding pads on the semiconductor die with respective leads 102-1, 102-2, ..., and 102-n. As shown in further detailed below, a lower surface of each of leads 102-1, 102-2, ..., and 102-n can be exposed as external terminals for the packaged integrated circuit. The lower surfaces of ring 104 and die attach pad 103 can be similarly exposed to allow more efficient heat dissipation, so as to achieve enhanced thermal performance for the package. Ring 104, which is connected by tie bars 107a, 105b, 105c and 105d to die pad 103, is typically wire-bonded to one or more ground terminals on the semiconductor die, so as to provide a common ground plane for the integrated circuit. Ring 104 is suspended from the rest of lead frame 100 by tie bars 107a, 107b, 107c and 107d, and spaced from die attach pad 103 by slots 106a, 106b, 106c and 106d. Unlike die attach pad 103, ring 104 and leads 102-1, 102-2, ... and 102-n, tie bars 107a, 107b, 107c and 107d are typically half-etched so as to allow them to be substantially completely enclosed in the plastic encapsulation.

FIG. 2 shows a cross section of packaged integrated circuit 200, which includes lead frame 100 in accordance with the present invention. To simplify this description, like elements in FIGS. 1 and 2 are assigned like reference numerals. In packaged integrated circuit 200, semiconductor die 201 is bonded by die-attach epoxy 205 to die attach pad 103. Wire-bonds 203-a and 203-b couple the ground conductors on semiconductor die 201 to ring 104 of lead frame 100. Similarly, FIG. 2 shows wire-bonds 203-l and 203-m coupling terminals on semiconductor die 201 to corresponding leads 102-l and 102-m of lead frame 100. Wire-bonds 203-a, 203-b, 203-l and 203-m can be achieved using gold wires of an appropriate gauge. The exposed lower surfaces of lead frame 100 of packaged integrated circuit 200 can be coated with a solder plating to enhance electrical contact to an underlying circuit board. A resin or plastic molding compound 202 is provided to form the plastic encapsulation.

In packaged integrated circuit 200, slots 106a, 106b, 106c and 106d between ring 104 and die attach pad 103 lock molding compound 202 between die attach pad 103 and ring 104, thus preventing molding compound 202 from delaminating from ring 104 or die attach pad 103, and providing packaged integrated circuit 200 enhanced moisture-resistance after solder reflow.

The above-detailed description is provided to illustrate specific embodiments of the present invention and is not intended to be limiting. Numerous variations and modifications within the scope of the present invention are possible. The present invention is set forth in the following claims.

I claim:

1. An integrated circuit package for accommodating a semiconductor die, comprising:
   a conductive lead frame including (a) a die attach pad for accommodating said semiconductor die, (b) a ring provided adjacent to said die attach pad, and (c) a plurality of leads provided outside of said ring;
   a plurality of wire-bonds electrically coupling terminals on said semiconductor die to said ring and said leads; and
   an insulative encapsulation enclosing said semiconductor die and said wire-bonds and exposing a surface of each of said leads to allow external electrical contact.

2. An integrated circuit package as in claim 1, wherein said die attach pad and said ring are spaced from each other by slots filled by said insulative encapsulation, except at one or more designated metal connections.

3. An integrated circuit package as in claim 1, wherein said insulative encapsulation comprises a resin-molding compound.

4. An integrated circuit package as in claim 1 further comprising a solder plating at surfaces of said lead frame exposed to the exterior of said integrated circuit package.

5. An integrated circuit package as in claim 1, further comprising tie bars suspending said ring to said lead frame, said tie-bars having a reduced thickness relative to a thickness of said ring.

* * * * *

UNITED STATES PATENT AND TRADEMARK OFFICE
CERTIFICATE OF CORRECTION

PATENT NO. : 6,545,347 B2
DATED : April 8, 2003
INVENTOR(S) : Neil Mclellan

It is certified that error appears in the above-identified patent and that said Letters Patent is hereby corrected as shown below:

<u>Title page,</u>
Item [75], Inventor, change paragraph to -- Neil Mclellan, Hong Kong (HK) --

Signed and Sealed this

Twelfth Day of August, 2003

JAMES E. ROGAN
*Director of the United States Patent and Trademark Office*